United States Patent
Lee et al.

(10) Patent No.: US 7,453,377 B2
(45) Date of Patent: Nov. 18, 2008

(54) APPARATUS AND METHODS FOR SEARCHING A PATTERN IN A COMPRESSED DATA

(75) Inventors: Tsern-Huei Lee, HsinChu (TW); Nai-Lun Huang, Pingjhen (TW)

(73) Assignee: Reti Corporation, Taipei (TW)

( * ) Notice: Subject to any disclaimer, the term of this patent is extended or adjusted under 35 U.S.C. 154(b) by 4 days.

(21) Appl. No.: 11/710,827

(22) Filed: Feb. 26, 2007

(65) Prior Publication Data

US 2008/0036630 A1 Feb. 14, 2008

Related U.S. Application Data

(60) Provisional application No. 60/836,519, filed on Aug. 9, 2006.

(51) Int. Cl.
*H03M 7/34* (2006.01)
(52) U.S. Cl. .......................................... 341/51; 341/106
(58) Field of Classification Search .................... 341/51, 341/50, 106; 358/1.9, 518
See application file for complete search history.

(56) References Cited

U.S. PATENT DOCUMENTS

| | | | | |
|---|---|---|---|---|
| 6,145,077 A | * | 11/2000 | Sidwell et al. | 712/300 |
| 6,320,523 B1 | * | 11/2001 | York et al. | 341/106 |
| 7,233,266 B2 | * | 6/2007 | Sasakura | 341/51 |
| 2003/0107753 A1 | * | 6/2003 | Sakamoto | 358/1.9 |

* cited by examiner

*Primary Examiner*—Peguy JeanPierre
(74) *Attorney, Agent, or Firm*—Wang Law Firm; Li Kan Wang

(57) ABSTRACT

A compressed pattern matching based on LZW compressed sequences with a simple bitmap-based realization of the Amir-Benson-Farach algorithm is provided. A suffix trie for a searched pattern is determined and a LZW trie is constructed for a compressed data. For each data chunk in the compressed data a variety of information is determined and a node is added to the LZW trie. The queries used to determine the information are implemented through bitmaps, and allowing identification of all occurrence of the searched pattern.

13 Claims, 10 Drawing Sheets

300

| Prefix chunks | Prefix # |
|---:|:---:|
| ...xxa | 1 |
| ...xxab | 2 |
| ...xxabc | 3 |
| ...xxabca | 4 |
| ...xxabcab | 5 |

| Suffix chunks | Suffix # |
|:---|:---:|
| abcabxx... | 5 |
| bcabxx... | 4 |
| cabxx... | 3 |
| abxx... | 2 |
| bxx... | 1 |

| Internal chunks |
|:---:|
| a |
| ab |
| abc |
| abca |
| abcab |
| b |
| bc |
| bca |
| bcab |
| c |
| ca |
| cab |

FIG. 5 uncompacted suffix
trie *STp* of *P* = *ababc*

FIG. 8

| Prefix chunks | Prefix # | Bitmap |
|---|---|---|
| ...xxa | 1 | 01000 |
| ...xxab | 2 | 00100 |
| ...xxaba | 3 | 01010 |
| ...xxab<u>ab</u> | 4 | 00101 |
| ...xxababc | 5 | 00000 |

| Internal chunks |
|---|
| a |
| ab |
| aba |
| abab |
| ababc |
| b |
| ba |
| bab |
| babc |
| abc |
| bc |
| c |

| Suffix chunks | Suffix # | Bitmap |
|---|---|---|
| ababcxx... | 5 | 10000 |
| babcxx... | 4 | 01000 |
| abcxx... | 3 | 00100 |
| bcxx... | 2 | 00010 |
| cxx... | 1 | 00001 |

1000

| Prefix chunks | Prefix # | Bitmap |
|---|---|---|
| ...xxa | 1 | 01000 |
| ...xxab | 2 | 00100 |
| ...xxabb | 3 | 00010 |
| ...xxabba | 4 | 01001 |
| ...xxabbac | 5 | 00000 |

| Suffix chunks | Suffix # | Bitmap |
|---|---|---|
| abbacxx... | 5 | 10000 |
| bbacxx... | 4 | 01000 |
| bacxx... | 3 | 00100 |
| acxx... | 2 | 00010 |
| cxx... | 1 | 00001 |

| Internal chunks |
|---|
| a |
| ab |
| abb |
| abba |
| abbac |
| b |
| bb |
| bba |
| bbac |
| ba |
| bac |
| ac |
| c |

Initialize: variable *Prefix* ← 0 for *l* = 1 to *n* do (Let $P_x$, $S_x$, and *I* denote node *S.Z[l]*'s prefix number, suffix number, and internal range, respectively.)

1   LZW Trie Construction 1.1  Add a new node numbered *l+q* to $T_s$ as a child node of *S.Z[l]*. Let *a* be the label of node *l+q*.

1.2  The first symbol of *l+q*'s chunk is that of *S.Z[l]*'s chunk.

1.3  *a* is the first symbol of *S.Z[l+1]*'s chunk. (If *S.Z[l+1]* = *l+q* then the first symbol of *S.Z[l+1]*'s chunk is the same as that of *S.Z[l]*'s chunk.)

1.4  If *S.Z[l]* is an internal node (Let $S_1$ denote the string represented by *S.Z[l]*.)

Set *l+q*'s internal range [*i, j*] as $Q_3(S_1, \alpha)$.

Else

Set *l+q*'s internal range [*i, j*] as [0, 0].

1.5  If *j* = *m*, set *l+q*'s suffix number as *m-i+*1. Otherwise, set *l+q*'s suffix number as $S_x$.

1.6  Set *l+q*'s prefix number as $Q_1(P_x, I_a)$, where $I_a$ is the internal range of *a*.

2   Pattern Search

If *Prefix* = 0

*Prefix* ← $P_x$

Else        // *Prefix* ≠ 0

If *S.Z[l]* is a suffix node      // $S_x \neq 0$

// Check the pattern occurrence with $Q_2(Prefix, S_x)$

If $Q_2(Prefix, S_x) \neq 0$

A pattern occurrence is found

If *S.Z[l]* is an internal node    // *I* ≠ [0, 0]

*Prefix* ← $Q_1(Prefix, I)$

Else        // *S.Z[l]* is not an internal node

*Prefix* ← $P_x$

FIG. 16

Initialize: *Prefix* ← 0, *COUNT* ← 0 for *l* = 1 to *n* do (Let $P_x$, $S_x$, *I*, *F*, and *D* denote node *S.Z[l]*'s prefix number, suffix number, internal range, PIF, and depth, respectively.)

1    <u>LZW Trie Construction</u>

1.1    Add a new node numbered *l+q* to $T_s$ as a child node of *S.Z[l]*. Let *a* be the label of node *l+q*.

1.2    The first symbol of *l+q*'s chunk is that of *S.Z[l]*'s chunk.

1.3    *a* is the first symbol of *S.Z[l+1]*'s chunk. (If *S.Z[l+1]* = *l+q* then the first symbol of *S.Z[l+1]*'s chunk is the same as that of *S.Z[l]*'s chunk.)

1.4    If *S.Z[l]* is an internal node (Let $S_1$ denote the string represented by *S.Z[l]*.)

Set *l+q*'s internal range [*i, j*] as $Q_3(S_1, \alpha)$.

Else

Set *l+q*'s internal range [*i, j*] as [0, 0].

1.5    If *j* = *m*, set *l+q*'s suffix number as *m-i+1*. Otherwise, set *l+q*'s suffix number as $S_x$.

1.6    Set *l+q*'s prefix number as $Q_1(P_x, I_\alpha)$, where $I_\alpha$ is the internal range of *a*.

1.7    If *F* = 0 and *l+q*'s prefix number = *m*, then *l+q*'s PIF ← 1.

Else, *l+q*'s PIF ← *F*.

1.8    Set the depth of node *l+q* as *D+1*.

1.9    If $P_x$ = *m*, then *l+q*'s PIP ← *S.Z[l]*.

Else, *l+q*'s PIP ← *S.Z[l]*'s PIP.

FIG. 17A

2  Pattern Search

If $S_x \neq 0$

Check cross-boundary occurrences with the bitwise AND operation for query $Q_2(Prefix, S_x)$. Let $R = r_1 r_2 ... r_m$ be the result of the bitwise AND operation.

for $k = 1$ to $m$ do

If $r_k = 1$

Report the position: $COUNT - k + 2$

If $F = 1$    // Pattern is inside $S.Z[I]$

If $P_x = m$

Report the position: $COUNT + D - m + 1$ $N \leftarrow S.Z[I]$'s PIP

While $N \neq 0$

Report the position: $COUNT + Dep(N) - m + 1$ $N \leftarrow N$'s PIP $Prefix \leftarrow Q_1(Prefix, I)$    // Note that the answer of $Q_1(Prefix, I)$ is $P_x$, if the result of bitwise AND operation for $Q_1(Prefix, I)$ is all-zero $COUNT \leftarrow COUNT + D$

FIG. 17B

APPARATUS AND METHODS FOR SEARCHING A PATTERN IN A COMPRESSED DATA

CROSS REFERENCE TO RELATED APPLICATION

This application claims the priority and benefits for U.S. Provisional Patent Application No. 60/836,519, Efficient Pattern Matching Scheme In LZW Compressed Sequences, filed on Aug. 9, 2006, the specification of which is incorporated herein by this reference.

BACKGROUND OF THE INVENTION

1. Field of the Invention

The present invention relates to data security, and more specifically, relates to recognition of a data pattern in a data stream.

2. Description of Related Art

As the population of communication networks users grows at a rapid rate, it is expected that the networks be capable of delivering data more effectively. In other words, how to utilize the transmission bandwidth efficiently is a key upon which the success of the communication networks heavily relies. Obviously, an economic way to utilize limited bandwidth efficiently is to send smaller amount of data by using data compression mechanisms. Accordingly, compressed pattern matching (CPM) that performs pattern search directly on the compressed data without initial decompression gains more and more attention.

Compressed pattern matching (CPM) is an emerging research field addressing the problem: given a compressed sequence and a pattern, find the pattern occurrence(s) in the (uncompressed) sequence with minimal (or no) decompression. It can be-applied to detection of computer virus and confidential information leakage in compressed files directly.

Since Lempel-Ziv-Welch (LZW) compression algorithm is one of the most effective and popular lossless compression algorithms, CPM in LZW compressed sequences is quite important. In the last decade, many related researches have been conducted. The first CPM algorithm which finds the first pattern occurrence in an LZW compressed file was developed and it employs an algorithm that takes $O(n+m^2)$ time and space, where n and m are, respectively, the lengths of the compressed text and the pattern. However, with different implementations, one can trade between the amount of extra space used and the algorithm's time complexity. This algorithm is referred to as the Amir-Benson-Farach (ABF) algorithm.

There were proposals to extend the ABF algorithm to find all pattern occurrences. The basic idea is to use a flag to indicate that complete pattern occurs inside a compressed data block, in addition to checking pattern occurrences across two consecutive blocks. However, the algorithm cannot tell how many occurrences are there inside a block. Another CPM algorithm was proposed to do decompression and pattern matching on the fly. The drawback of the algorithm is its high computation complexity because it still needs partial decompression. Another algorithm, Navarro-Raffinot (NR), presents a general scheme to find all pattern occurrences in sequential blocks and realizes the scheme by using the technique of bit-parallelism. This scheme can be applied to LZ-family compression algorithms such as LZW and LZ77.

Notwithstanding all the algorithms that have been proposed, the implementation of these algorithms involves complex computation and demands complex hardware and large memory. Therefore, it is desirous to have an apparatus and method that finds occurrences of a specified pattern in a sequence of compressed data with no decompression, and it is to such apparatus and method the present invention is primarily directed.

SUMMARY OF THE INVENTION

The present invention introduces a simple and efficient realization of the ABF algorithm and a generalization of the ABF algorithm that can find all pattern occurrences and reporting their absolute positions in an uncompressed sequence. In one embodiment, the present invention is a method for searching a pattern in a compressed data. The method includes the steps of receiving a compressed data with a plurality of data chunks, obtaining a first data chunk from the compressed data, retrieving a first bitmap from a first table based on the first data chunk, obtaining a second data chunk from the compressed data, retrieving a second bitmap from a second table based on the second data chunk, deriving a first result by a bit-wise ANDing the first bitmap with the second bitmap, and indicating the pattern being present in the compressed data if there is at least one bit set in the first result.

In another embodiment, the present invention is an apparatus for searching a pattern in a compressed data. The apparatus includes a data receiving unit for receiving compressed data and a pattern searching unit for analyzing the received compressed data. The pattern searching unit is capable of performing the steps of receiving a compressed data with a plurality of data chunks, obtaining a first data chunk from the compressed data, retrieving a first bitmap from a first table based on the first data chunk, obtaining a second data chunk from the compressed data, retrieving a second bitmap from a second table based on the second data chunk, deriving a first result by a bit-wise ANDing the first bitmap with the second bitmap, and indicating the pattern being present in the compressed data if there is at least one bit set in the first result.

The present system and methods are therefore advantageous as they enable rapid identification of viruses in a data communication system. Other advantages and features of the present invention will become apparent after review of the hereinafter set forth Brief Description of the Drawings, Detailed Description of the Invention, and the Claims.

DESCRIPTION OF THE DRAWINGS

FIG. 3 depicts a prefix table for a search pattern.

FIG. 4 depicts a suffix table for a search pattern.

FIG. 5 depicts an internal chunk table for a search pattern.

FIGS. 8, 9, and 10 illustrate a prefix table, a suffix table, and an internal chunk table for a search pattern.

FIG. 16 is a flowchart for a compressed text scanning procedure.

FIGS. 17A and 17B are flowchart for another compressed text scanning procedure.

DETAILED DESCRIPTION OF THE INVENTION

In this description, the term "application" as used herein is intended to encompass executable and non-executable software files, raw data, aggregated data, patches, and other code segments. The term "exemplary" is meant only as an example, and does not indicate any preference for the embodiment or elements described. Further, like numerals refer to like elements throughout the several views, and the articles "a" and "the" includes plural references, unless otherwise specified in the description.

Figure 1A:
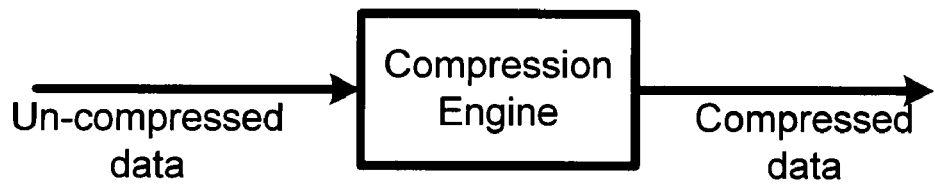
FIG. 1A illustrates data compression by a data compression engine.

In overview, the present system and method provide a system and method for efficiently finding patterns in a compressed data stream without decompressing the data stream. It is firstly described the LZW compression algorithm and the corresponding decompression procedure. FIG. 1A illustrates an uncompressed data S becoming a compressed data S.Z after being compressed by a data compression engine; the data compressed engine compresses data according to the LZW compression algorithm. Let $S=c_1c_2c_3\ldots c_u$ be the uncompressed sequence (or text) of length u over alphabet $\Sigma=\{a_1, a_2, a_3, \ldots, a_q\}$, where q is the size of the alphabet. The LZW compressed format of S is S.Z and each code in S.Z is S.Z[i], where $1 \leq S.Z[i] \leq n+q-1$ for $i=1, 2, \ldots, n$. The compressed data S.Z is essentially a sequence of code words.

The LZW is a dictionary-based compression algorithm that uses a trie $T_S$ to generate the compressed sequence. Each node on $T_S$ contains:

A node number: A unique number in the range [0, n+q−1]. ("node N" or "N" represents "the node numbered N")

A label: A symbol belonging to $\Sigma \cup \{NULL\}$.

A chunk: The string that the node represents. It is simply the concatenation of the labels on the path from root to the node.

$T_S$ and the compressed sequence are constructed as follows:
1. $T_S$ is initialized as a (q+1)-node trie consisting of a root node numbered 0 and labeled NULL and q child nodes numbered 1, 2, . . . , q. Child node i is labeled $a_i$.
2. During compression, the LZW algorithm finds the longest prefix of the uncompressed sequence that is a chunk represented by some node N on $T_S$ and outputs N to S.Z. $T_S$ is then grown by adding a new node as a child of N. The new node's label is the next un-encoded symbol in the sequence. At the end of the compression, there are n+q nodes on $T_S$.

Figure 2:
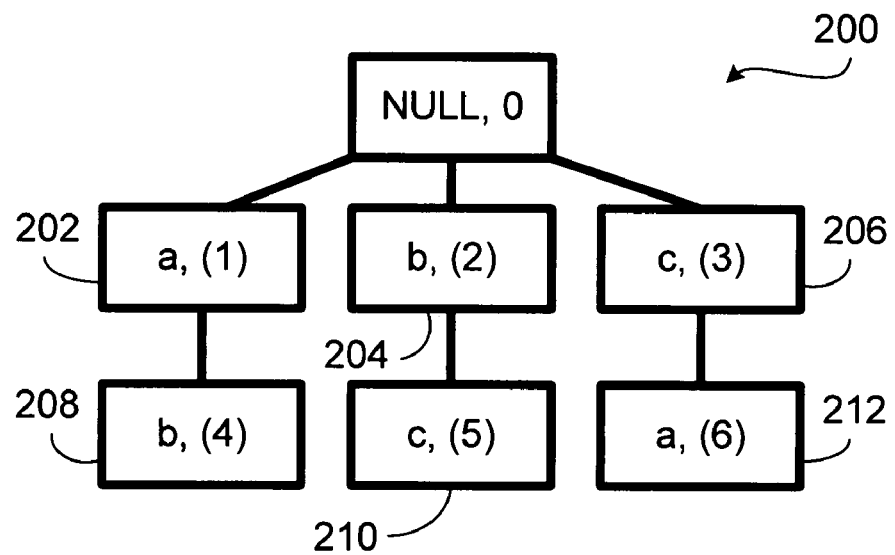
FIG. 2 depicts a dictionary trie for an alphabet and a text string according to LZW algorithm.

FIG. 2 illustrates a trie $T_S$ 200 based on the LZW compression algorithm. The trie 200 has a root node labeled as NULL and its node number is 0. The initial node set includes one node for each element of the alphabet. In this example, the alphabet set is {a, b, c} and initially three nodes 202, 204, 206 are presented under the root node. These three nodes are labeled a, b, and c and numbered 1, 2, and 3 respectively. The trie is updated with during the compression process. For example, after compressing the string S=abcab, three new nodes 208, 210, 212 labeled as b, c, and a and numbered 4, 5, and 6 respectively are created. Node 4 represents chunk ab, node 5 represents chunk bc, and node 6 represent chunk ca. The compressed sequence for S=abcab is {(1), (2), (3), (4)}. If the string S=abcabb, then another node with number 7 would be added under node numbered 4 and labeled as b. Node numbered 7 would represent abb. The compressed sequence for S=abcabb would be {(1), (2), (3), (4), (2)}.

The decompression procedure constructs the same trie $T_S$ and uses it to decode S.Z. Both compression and decompression can be done in time O(u). The following observation makes it possible to construct $T_S$ from S.Z in time O(n) without decoding S.Z [2]. Note that, in order to construct $T_S$ from S.Z, an additional symbol is stored in each node. This additional symbol is the first symbol of the node's chunk.

Observation—the code S.Z[I], $1 \leq I \leq n-1$, causes creation of a new node numbered I+q as a child of node S.Z[I].

The first symbol of I+q's chunk is that of S.Z[I]'s chunk.

The last symbol or the label of node I+q is the first symbol of S.Z[I+1]'s chunk. (If S.Z[I+1]=I+q then the first symbol of S.Z[I+1]'s chunk is the same as that of S.Z[I]'s chunk.)

The Amir-Benson-Farach (ABF) algorithm is an effective scheme that finds the first pattern occurrence in LZW compressed sequence without decompression. Let pattern $P = p_1p_2p_3 \ldots p_m$, where m denotes the length of P and $p_i \in \Sigma$ for $1 \leq i \leq m$. For convenience, the notation $S_1 S_2$ is used to denote the concatenation of two strings $S_1$ and $S_2$. To facilitate pattern matching, the following terms of a node on $T_S$ are defined with respect to pattern P that is being searched.

Definition 1: A chunk is a prefix chunk if it ends with a non-empty prefix of P. Similarly, a chuck is a suffix chunk if it begins with a non-empty suffix of P.

Definition 2: A chunk is an internal chunk if it is an internal substring of P. That is, the substring $p_i \ldots p_j$ is an internal chunk if $1 \leq i \leq j \leq m$.

Definition 3: The prefix number of a chunk is the length of the longest pattern prefix the chunk ends with. Similarly, the suffix number of a chunk is the length of the longest pattern suffix the chunk begins with.

Definition 4: The internal range [i, j] of a chunk indicates that the chunk is the internal chunk $p_i \ldots p_j$ if $1 \leq i \leq j \leq m$, or not an internal chunk if i=j=0.

If a node's chunk is a prefix chunk, a suffix chunk, or an internal chunk, the node is called a prefix node, a suffix node, or an internal node, respectively. Prefix number=0, suffix number=0, or internal range=[0, 0] means that the node is not a prefix node, a suffix node, or an internal node, respectively.

For each pattern that is being searched, three tables are used to assist the search for pattern P =abcab. FIG. 3 illustrates a prefix table 300, FIG. 4 illustrates a suffix table 400, and FIG. 5 illustrates an internal chunk table 500. These tables are created and stored, and the knowledge about their content is needed during a pattern search. The "prefix #" of a chunk is the length of the longest pattern prefix the chunk ends with. The "suffix #" of a chunk is the length of the longest pattern suffix the chunk beings with. The internal chunk is an internal substring of P and identified by I=[i, j].

Figure 6:
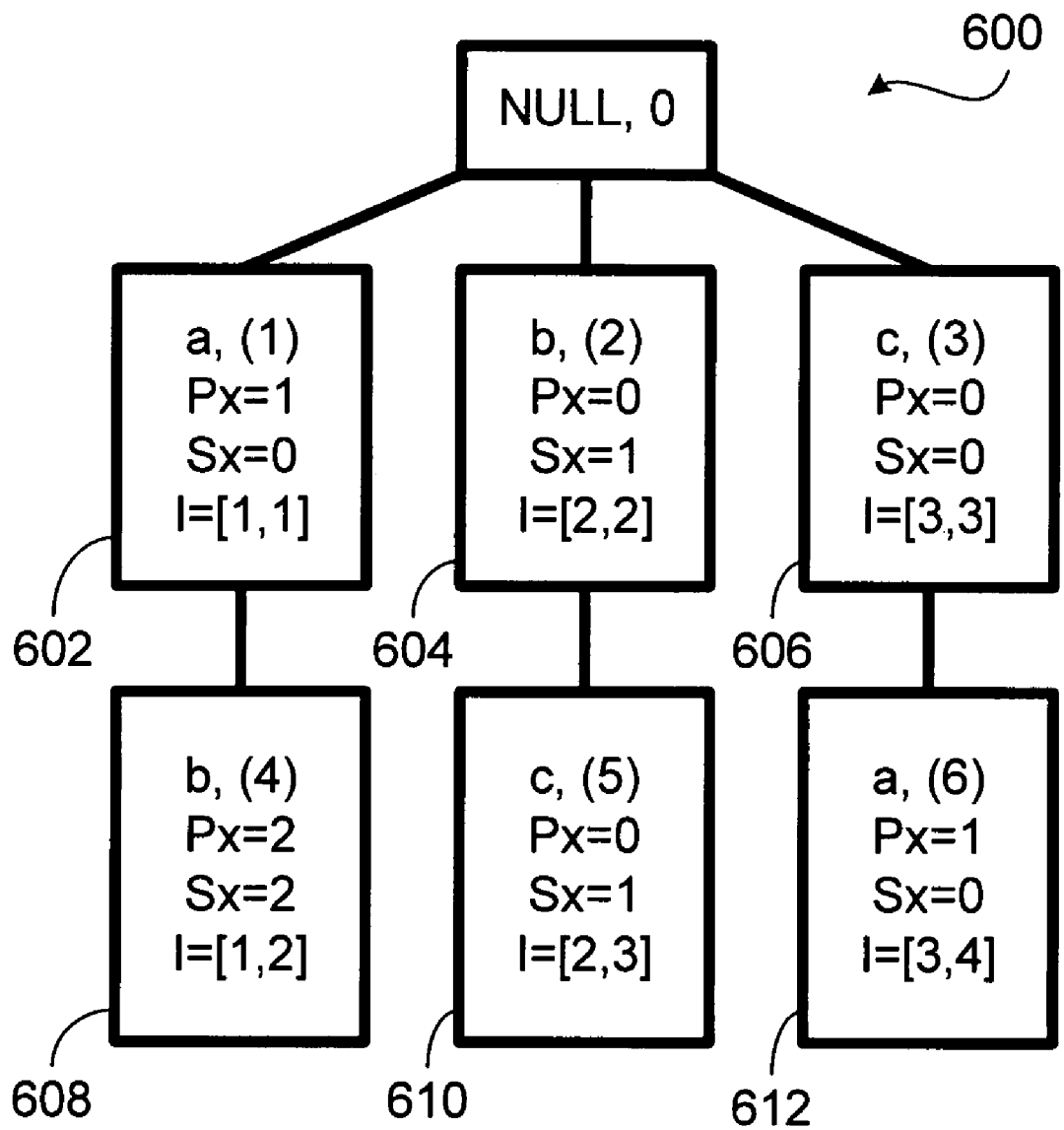
FIG. 6 depicts a dictionary trie with prefix # Px and suffix # Sx attached on each node.

Before searching for a pattern at a receiving end where an incoming data stream is received, a suffix trie is built based on the knowledge about the pattern to be searched. Take the example of the compressed screen discussed previously for FIG. 2. S=abcab and the compressed sequence is {(1), (2), (3), (4)}. For the dictionary trie, each node, besides having a label and a number, will have information about prefix # ($P_x$), suffix # ($S_x$), internal range (I). $P_x$, $S_x$, and I are derived based on the pattern P =abcab. For example for node 1, it would be labeled as "a" with $P_x=1$, $S_x=0$, and I=[1, 1]. For node 2, it would be labeled as "b" with $P_x=0$, $S_x=1$, and I=[2, 2]. FIG. 6 illustrates the dictionary trie of FIG. 2 with additional information derived based on the pattern P =abcab. This information is available to the compressed text scanning process when the ABF algorithm is applied.

The ABF algorithm consists of the Pattern Preprocessing part and the Compressed Text Scanning part that are described separately below. The pattern is pre-processed to allow answering the following queries:

1. Let $S_1$ be a pattern prefix with prefix number $P_x$ (which is 0 if $S_1$ is a null string) and $S_2$ be a string with internal range I (which is [0, 0] if $S_2$ is not an internal substring of P).

$Q_1(P_x,I)$=the length of the longest pattern prefix that is a suffix of $S_1 S_2$.

2. Let $S_1$ be a pattern prefix with prefix number $P_x$ (which is 0 if $S_1$ is a null string) and $S_2$ be a nonempty pattern suffix with suffix number $S_x$.

$$Q_2(P_x, S_x) = \begin{cases} i, & i \text{ is the smallest index of } S_1 S_2 \text{ where the pattern occurs.} \\ 0, & \text{no pattern occurs in } S_1 S_2. \end{cases}$$

3. Let $S_1$ be an internal substring of P and $\alpha \in \Sigma$.

$$Q_3(S_1, \alpha) = \begin{cases} [i, j], & S_1 \alpha \text{ is the internal substring } p_i \ldots p_j. \\ [0, 0], & S_1 \alpha \text{ is not an internal substring of } P. \end{cases}$$

Queries $Q_1$ and $Q_2$ are each implemented through a two-dimensional table. For example for $Q_1(P_x, I)$, a table with $P_x$ rows and I columns is used. For P =abcab, there are 5 types of prefix chunks and 12 internal chunks. Therefore, there would be 5 rows and 12 columns in the two-dimensional table for $Q_1$. For $Q_2(P_x, S_x)$, a table with $P_x$ rows and $S_x$ columns are used. For P =abcab, there are 5 types of suffix chunks. So, there would be 5 rows and 5 columns in the two-dimensional table for $Q_2$. For a search pattern of length m, the table for $Q_2$ is of order $O(m^2)$, and the table for $Q_1$ is of order $O(m^3)$, which can be reduced to $O(m^2)$ by ABF. When the search is automated, these two-dimensional tables are generally stored in memory locations.

The queries $Q_1$ and $Q_2$ can be further illustrated by the following examples. For P =ababc and $S_1$=aba and $S_2$=ba, $Q_1$=($P_x$, I)=3, since $P_x$=3 and I=[2,3]. $Q_1$=($P_x$, I)=3 indicates that the length of the longest suffix of $S_1 S_2$ that is a prefix of P is 3. For the same P, $S_1$, and $S_2$ above, $Q_2(P_x, S_x)$=0, since P is not found within "ababa." However, if $S_1$=abca and $S_2$=bcab, then $Q_2(P_x, S_x)$=1, since P starts on position 1 of the concatenated string "abcabcab." Query $Q_3$ will be explained later after the compressed text scanning process is introduced.

The compressed text scanning process is further divided into two components: the LZW Trie Construction and the Pattern Search. When constructing trie $T_s$, each node is assigned a node number, the first symbol of its chunk, a label, a prefix number, a suffix number, and an internal range. The Pattern Search part keeps track of the largest partial match and finds out if the partial match can be extended to a complete match. The compressed text scanning procedure is described in FIG. 16.

To answer query $Q_3$, it is needed to construct the suffix trie of P, denoted by $ST_P$. Note that there are m non-empty suffixes of P and the number of nodes in $ST_P$ is $O(m^2)$. Moreover, there is a unique node on $ST_P$ which represents a specific substring of P (even if the substring appears multiple times in P). Query $Q_3(S_1, \alpha)$ can be easily answered by tracing $ST_P$. If there is a node representing substring $S_1$ on $ST_P$ which has an outgoing edge labeled $\alpha$, then $S_1 \alpha$ is an internal substring of P. If no such node exists, then $S_1 \alpha$ is not an internal substring of P and its internal range is [0, 0].

Note that it is possible to reduce the space complexity of $ST_P$. A node on $ST_P$ is said to be explicit if and only if (iff) either it represents a suffix of P or it has more than one child node. The nodes that are not explicit are said to be implicit. One can construct the compacted $ST_P$ which contains only explicit nodes of the un-compacted $ST_P$ by eliminating all implicit nodes in between two explicit nodes. As a result, the label on each edge becomes a substring of P. The space complexity can be reduced because the number of explicit nodes on the un-compacted $ST_P$ is O(m).

Query $Q_3(S_1, \alpha)$ can be answered with the compacted $ST_P$ as follows. Let $S_1$ be an internal substring of P. If $S_1$ is represented by a node, say node N, on the compacted $ST_P$, then $S_1 \alpha$ is an internal substring iff $\alpha$ is the first symbol of a label on some outgoing edge of node N. Suppose that there is no node on the compacted $ST_P$ which represents $S_1$. In this case, one can find two nodes on the compacted $ST_P$, say nodes $N_1$ and $N_2$, such that node $N_1$ represents the longest prefix (could be empty) of $S_1$ and node $N_2$ represents the shortest internal substring of P which contains $S_1$ as a prefix. Note that node $N_1$ is actually a parent node of node $N_2$ on the compacted $ST_P$. Assume that node $N_1$ represents substring $S'_1$. As a result, $S_1 \alpha$ is an internal substring iff the $(|S_1|-|S'_1|+1)^{th}$ symbol of the label on the edge connecting nodes $N_1$ and $N_2$ is equal to $\alpha$.

Query $Q_3$ can be illustrated by the following example. For P =ababc and $S_1$=ab, if $\alpha$=a, then $Q_3(S_1, \alpha)$=[1, 3] and is identified by node 3 in FIG. 7. $Q_3(S_1, \alpha)$ indicates the internal range of $S_1 \alpha$. If $S_1 \alpha$ is a substring of P, then $Q_3(S_1, \alpha)$ returns a starting index and an ending index of the substring in P. In this example, $S_1 \alpha$=aba, which is a substring of P and the starting index is 1 and ending index is 3. If $\alpha$=c, then $Q_3(S_1, \alpha)$=[3, 5] and is identified by node 10 in FIG. 7. $S_1 \alpha$=abc, which is a substring of P and the starting index is 3 and ending index is 5. If $\alpha$=b, then $Q_3(S_1, \alpha)$=[0, 0], which indicates that $S_1 \alpha$=abb, is not a substring of P.

Queries $Q_1$ and $Q_2$ can be answered in constant time during text scanning if two tables, each consists of $O(m^2)$ entries, are constructed in advance. Each entry in the two tables requires $O(\log_2 m)$ bits. Obviously, when m is large, these two tables require significant amount of memory. The objective is then to reduce the size of memory required to implement queries $Q_1$ and $Q_2$. Another benefit of the present invention is the capability to find all occurrences of the searched pattern.

The implementation of query $Q_2$ is considered first. Given a pattern $P=p_1 p_2 p_3 \ldots p_m$ of length m, two sets of bitmaps are needed where each bitmap has m bits. The first set, called prefix bitmaps, consists of m bitmaps that correspond to the m possible prefix numbers 0, 1, 2, . . . , m−1. Let $A_i = \alpha_i^1 \alpha_i^2 \ldots \alpha_i^m$ denote the $i^{th}$ prefix bitmap which corresponds to prefix number i−1. It is assigned $\alpha_i^k$=1 iff k≦i and $p_{i-k+1} \ldots p_{i-1}$ is a non-empty prefix of P, i.e., $p_{i-k+1} \ldots p_{i-1} = p_1 \ldots p_{k-1}$. Note that $p_{i-k+1} \ldots p_{i-1}$ represents a null string if k=1. Clearly, with the assignment, $\alpha_i^1$=0 for all i, 1≦i≦m, $\alpha_i^1$=1 if 1≦i≦m, and $\alpha_i^j$=0 if j>i.

The second set of bitmaps, called suffix bitmaps, consists of m−1 bitmaps which correspond to the m−1 possible suffix numbers 1, 2, . . . , m−1. Again, the size of each suffix bitmap is m bits. Let $B_i = b_i^1 b_i^2 \ldots b_i^m$ be the $i^{th}$ suffix bitmap which corresponds to suffix number i. Assign $b_i^k$=1 iff k≧m−i+1 and $p_{m-i+1} \ldots p_{2m-i-k+1}$ is a non-empty suffix of P, i.e., $p_{m-i+1} \ldots p_{2m-i-k+1} = p_k \ldots p_m$. In other words, $b_i^k$=1 iff the length-(m−k+1) prefix of $p_{m-i+1} \ldots p_m$ is a non-empty suffix of P. Similarly, with the assignment, $b_i^{m-i+1}$=1 and $b_i^j$=0 if j<m−i+1.

It can now be shown that query $Q_2(P_x,S_x)$ can be answered with the two sets of bitmaps. Let $P_x=i-1$ and $S_x=k$. In other words, $S_1=p_1 \ldots p_{i-1}$, $S_2=p_{m-k+1} \ldots p_m$, and $S_1S_2=p_1 \ldots p_{i-1}p_{m-k+1} \ldots p_m$. Note that $S_1=p_1 \ldots p_{i-1}$ represents a null string if i=1. To answer query $Q_2$, the bitwise AND operation of $A_i$ and $B_k$ is first performed. Let $R=r_1r_2 \ldots r_m$ denote the result, i.e., $R=A_i \otimes B_k$, where $\otimes$ represents the bitwise AND operation. If i>1 and there is a cross-boundary pattern occurrence starting at the $j^{th}$ position of $S_1$, then it must hold that $p_j \ldots p_{i-1}$ is a prefix of P and $p_{m-k+1} \ldots p_{2m-k-i+j}$ is a suffix of P. Since $p_j \ldots p_{i-1}$ is a prefix of P, it follows $a_i^{i-j+1}=1$. Similarly, $p_{m-k+1} \ldots p_{2m-k-i+j}$ is a suffix of P implies $b_k^{i-j+1}=1$. Consequently, the pattern occurrence can be detected because it holds that $r_{i-j+1}=1$. To determine the first pattern occurrence, it needs only to identify the rightmost 1 of R. Assume that the rightmost 1 of R occurs in the $l^{th}$ position, i.e., $r_l=1$ and $r_i=0$ for $l+1 \leq i \leq m$, then the first pattern occurrence is found starting at the $(|S_1|-l+2)^{th}$ position of $S_1$. There is no pattern occurrence crossing the boundary of $S_1$ and $S_2$ if $r_x=0$ for all x, $1 \leq x \leq m$. In the case that i=1, i.e., $S_1$ is a null string, $a_i^x=0$ for all x, $1 \leq x \leq m$ implies $r_x=0$ for all x, $1 \leq x \leq m$.

To implement query $Q_3$, construction of the compacted suffix trie $ST_P$ is needed. The answer of $Q_3$ can be obtained by tracing the compacted $ST_P$, as mentioned before. It is obvious that the implementation can result in correct answer for query $Q_3$ and thus its proof is omitted.

The implementation of query $Q_1$ is now considered. A third set of m-bit bitmaps are required. For convenience, the non-empty suffixes of P is numbered so that suffix k is of length k, $1 \leq k \leq m$. A bitmap is needed to be associated with each node on the compacted $ST_P$. Consider the bitmap $C_N=c_N^1c_N^2 \ldots c_N^m$ associated with a particular node N. Assign $c_N^i=0$ for all i, $1 \leq i \leq m$, if node N is the root node. The bitmap associated with the root node is for the internal range [0, 0]. Assume that node N is not the root node. It is clear that node N represents a unique non-empty substring of P. Assign $c_N^{m-k+1}=1$ iff node N represents suffix k or the node which represents suffix k is a descendent node of N. Note that the above assignment results in $c_N^{m-k+1}=1$ iff the string represented by node N is a non-empty prefix of suffix k.

With the prefix bitmaps and the bitmaps associated with the nodes on the compacted $ST_P$, one can now answer query $Q_1(P_x, I)$. Let M be the node on the LZW trie $T_S$ which represents the string $S_2$ with internal range I. Also, let N be the node on the compacted $ST_P$ which either represents $S_2$ or the string it represents is the shortest string represented by any node on the compacted $ST_P$ which contains $S_2$ as a prefix. Node M contains a pointer which points to the bitmap associated with node N. To answer query $Q_1(P_x, I)$, it is performed the bitwise AND operation of the prefix bitmap corresponding to prefix number $P_x$ and the bitmap pointed to by the pointer stored in node M. Let $R=r_1r_2 \ldots r_m$ denote the result of the bitwise AND operation. If $r_i=0$ for all i, $1 \leq i \leq m$, then $Q_1(P_x,I)$ returns the prefix number of node M. Assume that $r_i=1$ for at least one i. The answer of $Q_1(P_x, I)$ equals $(k-1)+Dep(M)$ if $r_k=1$ and $r_i=0$, $k+1 \leq i \leq m$, where Dep(M), the depth of node M, denotes the length of the chunk represented by node M.

The correctness of the above implementation for query $Q_1(P_x, I)$ can be proved as follows. Assume that $P_x=i-1$ so that $S_1=p_1 \ldots p_{i-1}$. If i>1 and the longest pattern prefix that is a suffix of $S_1 S_2$ starts at the $j^{th}$ position of $S_1$, then it holds that $p_j \ldots p_{i-1}$ is a prefix of P and suffix m-i+j contains $S_2$ as a prefix. As a result, $a_i^{i-j+1}=1$ and $c_N^{i-j+1}=1$ which implies $r_{i-j+1}=1$. In other words, such a prefix can be detected by the bitwise AND operation. Since the searching is for the longest pattern prefix, the rightmost 1 of R is selected. If it happens in the $k^{th}$ position, then the symbol $p_{i-k+1}$ starts the longest pattern prefix whose length is equal to $(k-1)+Dep(M)$. Of course, if $r_i=0$ for all i, $1 \leq i \leq m$, then the longest pattern prefix is completely contained in $S_2$, which implies the length of the longest pattern prefix is equal to the prefix number of node M. Therefore, the above implementation does result in correct answer for query $Q_1$. Below are two examples.

EXAMPLE 1

Let P =abcab. Table 1(a) and Table 1(b) show the prefix bitmaps and the suffix bitmaps of P, respectively. As an example of query $Q_2(P_x, S_x)$, assume that $S_1$=abca and $S_2$=bcab. Consequently, $P_x$=4, $S_x$=4, and R=01001. For this example, the first pattern occurrence starts at the first position of $S_1$. In fact, as indicated by the two 1's appeared in R, there are two pattern occurrences in $S_1S_2$.

TABLE 1(a)

Prefix bitmaps

| $P_x$ | Prefix | Bitmap # | Bitmap |
|---|---|---|---|
| 0 | NULL | 1 | 00000 |
| 1 | a | 2 | 01000 |
| 2 | ab | 3 | 00100 |
| 3 | abc | 4 | 00010 |
| 4 | abca | 5 | 01001 |

TABLE 1(b)

Suffix bitmaps

| $S_x$ | Suffix | Bitmap # | Bitmap |
|---|---|---|---|
| 1 | b | 1 | 00001 |
| 2 | ab | 2 | 00010 |
| 3 | cab | 3 | 00100 |
| 4 | bcab | 4 | 01001 |

EXAMPLE 2

Figure 7:
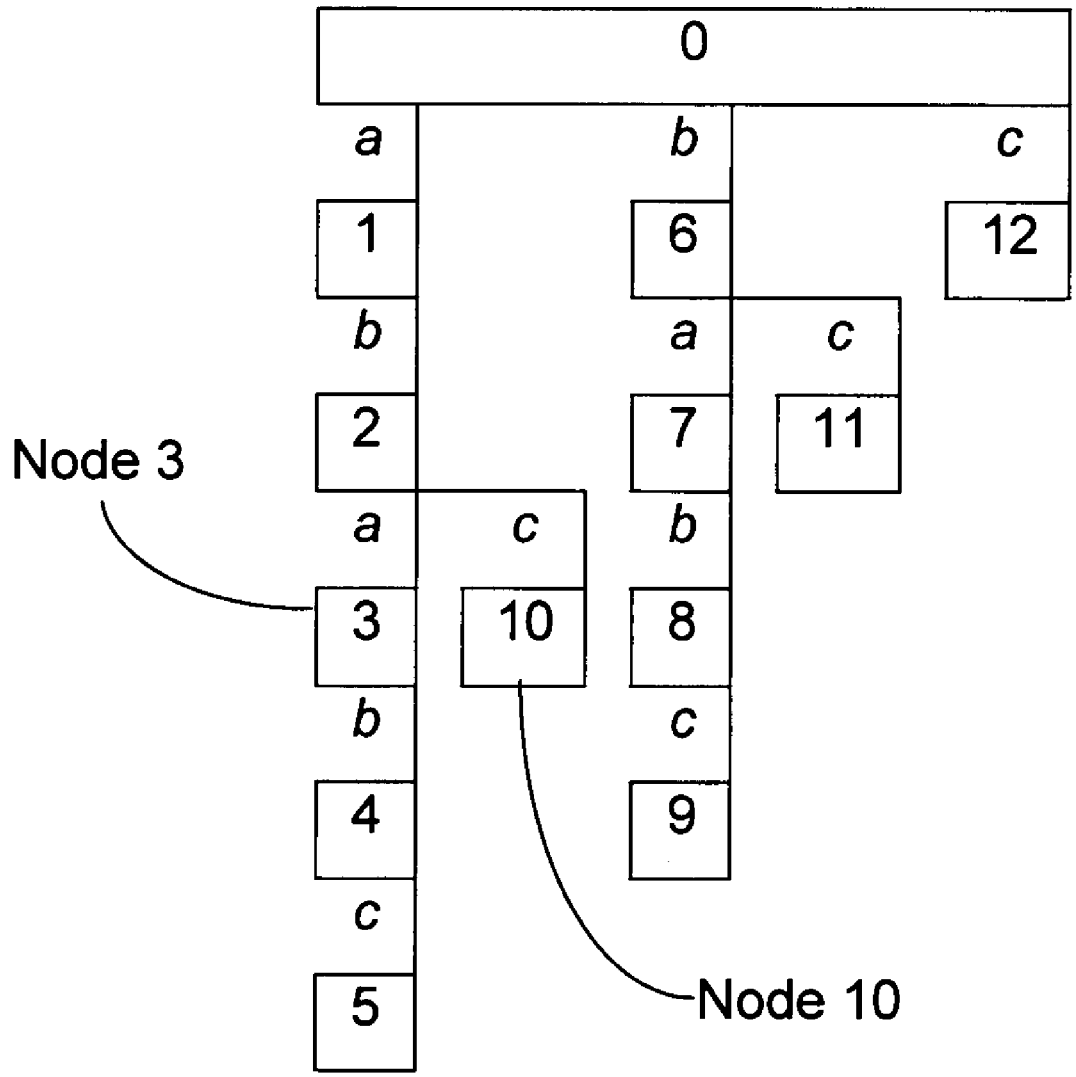
FIG. 7 depicts a suffix trie for a search pattern.

Let P =ababc. Table 2(a) shows the prefix bitmaps of P. For ease of description, the un-compacted suffix trie $ST_P$ of P as illustrated in FIG. 7 is used. The bitmaps associated with the explicit nodes of $ST_P$ are given in Table 2(b). As an example of query $Q_1(P_x,I)$, assume that $S_1$=abab and $S_2$=ab. Consequently, we have $P_x$=4, and I=[1, 2] (or [3, 4]). In this implementation, I=[1, 2] (or [3, 4]) is represented by node 2 of the un-compacted suffix trie $ST_P$. Since $P_x$=4 corresponds to the prefix bitmap 00101 and the bitmap associated with node 2 on $ST_P$ is 10100, it follows R=00100. As a result, the answer of query $Q_1(4, [1, 2])$ (or $Q_1(4, [3, 4])$) is $(3-1)+|S_2|=2+2=4$. As another example, if $S_1$=ab and I=[2, 4] (the bitmap to be used is the one associated with node 9 of $ST_P$) which represents string $S_2$=bab, then it follows $P_x$=2 and $R=00100 \otimes 01000=00000$. In this case, the answer of query $Q_1(2, [2, 4])$ is 2, i.e., the prefix number of bab.

Let us consider now examples of query $Q_3(S_1,\alpha)$. Assume that $S_1$=ab which is represented by node 2 of the un-compacted $ST_P$. If $\alpha$=b, then $Q_3(S_1,\alpha)$=[0, 0] because there is no transition from node 2 to any node with label b. However, if $\alpha$=c, then $Q_3(S_1,\alpha)$=[3, 5] which is represented by node 10 of $ST_P$.

TABLE 2(a)

Prefix bitmaps

| $P_x$ | Prefix | Bitmap # | Bitmap |
|---|---|---|---|
| 0 | NULL | 1 | 00000 |
| 1 | a | 2 | 01000 |
| 2 | ab | 3 | 00100 |
| 3 | aba | 4 | 01010 |
| 4 | abab | 5 | 00101 |

TABLE 2(b)

Bitmaps associated with explicit nodes

| Explicit node | Bitmap |
|---|---|
| 0 | 00000 |
| 2 | 10100 |
| 5 | 10000 |
| 6 | 01010 |
| 9 | 01000 |
| 10 | 00100 |
| 11 | 00010 |
| 12 | 00001 |

As mentioned before, the pattern occurrence checking in the original ABF algorithm is only performed cross two consecutive data blocks. Moreover, only the first occurrence is reported. To generalize the ABF algorithm to find all pattern occurrences, it is needed to consider all pattern occurrences cross two consecutive data blocks and those inside a data block as well. This implementation presented above allows detection of all pattern occurrences cross two consecutive data blocks. Therefore, the remaining work is to detect all pattern occurrences inside a data block. The generalization is designed to also report the absolute positions of pattern occurrences. Finding all pattern occurrences helps us to know how many occurrences are there, and reporting absolute positions helps us to know the distribution of occurrences.

To detect all pattern occurrences inside a data block, two fields, called pattern inside flag (PIF) and pattern inside pointer (PIP), are added to every node of the LZW trie $T_S$. The PIF flag is an indication of existence of patterns inside a node's chunk and the PIP pointer is used for backtracking to find the positions of all pattern occurrences inside the chunk. For the root node, its PIF is 0 and its PIP pointer points to the node itself, which is also 0. Assume that a new node M is to be added as a child node of node N. The PIP pointer of node M inherits the PIP value of node N if N is not a final node, i.e., a node whose chuck ends with the complete pattern P. To identify final nodes, the prefix number of a final node is made equal m. In case node N is a final node, the PIP pointer of node M points to node N. Similarly, the PIF of node M inherits the PIF value of node N unless the PIF of node N is 0 and node M is a final node. In this case, the PIF of node M is set to 1. With these additional fields, one can trace back the LZW trie to find all pattern occurrences inside a chunk. The trace-back ends once a node with PIP pointer points to the root node, i.e., PIP =0, is reached. Note that although PIF can be replaced by the PIP pointer and the prefix number (PIF =1 is equivalent to PIP ≠0 or prefix number =m), it is suggested to use PIF to simplify the checking of pattern existence inside a chunk.

Note that, since the prefix number of a node is set to m, it is needed to add to the set of prefix bitmaps an additional prefix bitmap corresponding to prefix number =m. The contents of the bitmap are assigned with the same algorithm described above. It is clear that the value of the variable Prefix may equal m too. However, it does not cause any error because the bitmap corresponding to prefix number =m is the same as the bitmap corresponding to prefix number =k, where $p_{m-k+1} \cdots p_m$ is the longest suffix of P which is also a proper prefix of P, i.e., a prefix which is not P itself. Note that $p_{m-k+1} \cdots p_m$ represents a null string if k =0.

For convenience, the suffix number of a node it set to be equal to m. As a consequence, another bitmap corresponding to suffix number =m is added to the set of suffix bitmaps. Again, the contents of the added suffix bitmap are assigned according to the algorithm described above and the additional suffix bitmap does not cause any error because $\alpha_i^1 = 0$ for all i, $1 \leq i \leq m+1$.

To report absolute positions of pattern occurrences, it is used the depth fields of nodes on the LZW trie $T_S$ and a global variable COUNT which stores the number of bytes in text S that have been scanned. Computation of the depth field is simple. The depth of the root node is 0. When node M is added as a child node of node N, the depth of node M equals that of node N plus one. Clearly, with the depth fields, one can compute the position of a node inside a chuck, which, together with the global variable COUNT, can be used to determine the absolute position of any pattern -occurrence. The overall generalized algorithm is described below.

The prefix bitmaps and the suffix bitmaps are computed. Also, the compacted suffix trie $ST_p$ of pattern P with the associated bitmaps are determined. When constructing the LZW trie $T_s$, each node's node number, label, prefix number, suffix number, internal range, the first symbol, depth, PIF, and PIP are computed and stored. The compressed text scanning procedure is described in FIGS. 17A and 17B.

The following example illustrates the process to detect all pattern occurrences and report their absolute positions.

EXAMPLE 3

As in Example 2, let P =ababc. The prefix bitmaps and the suffix bitmaps are shown in Tables 3(a) and 3(b) below, respectively. Since the suffix trie of pattern P and the bitmaps associated with the explicit nodes are not changed, they are not reproduced here. Assume that some of the compressed text had been processed and the current value of COUNT =100. Assume further that the last three chunks that had been processed are xxx, xxxx, and xaba, and the current chunk to be processed is $N_p$'s chunk.

Table 4 below shows the contents of the nodes along the path from the root node to node $N_p$ on the LZW tire. Note that there are two pattern occurrences inside $N_p$'s chunk which can be determined by tracing back the PIP pointers. Table 5 below shows a brief summary of the results when the last three chunks are processed. The procedure of pattern detection with report of absolute occurrence positions in processing $N_p$ is sketched below.

Reporting absolute positions of cross-boundary pattern occurrences:

Since $N_p$'s suffix number $S_x = 2 \neq 0$

II Check cross-boundary occurrences with bitwise AND operation for query $Q_2(Prefix, S_x)$.

Prefix =3 corresponds to the prefix bitmap 01010.

$S_x = 2$ corresponds to the suffix bitmap 00010.

The result of bitwise AND operation R = 01010 ⊗ 00010=00010.

The absolute occurrence position COUNT −4 +2 =98 is reported.

Reporting absolute positions of inside-chunk pattern occurrences:

Since $N_p$'s PIF =1

Since $N_p$'s PIP =$N_2 \neq 0$

The absolute occurrence position COUNT +Dep $(N_2)$−m +1 =109 is reported.

Since $N_2$'s PIP =$N_1 \neq 0$

The absolute occurrence position COUNT +Dep $(N_1)$−m +1 =103 is reported.

Since $N_1$'s PIP =0

The trace-back ends.

TABLE 3(a)

Prefix bitmaps

| $P_x$ | Prefix | Bitmap # | Bitmap |
|---|---|---|---|
| 0 | NULL | 1 | 00000 |
| 1 | a | 2 | 01000 |
| 2 | ab | 3 | 00100 |
| 3 | aba | 4 | 01010 |
| 4 | abab | 5 | 00101 |
| 5 | ababc | 6 | 00000 |

TABLE 3(b)

Suffix bitmaps

| $S_x$ | Suffix | Bitmap # | Bitmap |
|---|---|---|---|
| 1 | c | 1 | 00001 |
| 2 | bc | 2 | 00010 |
| 3 | abc | 3 | 00100 |
| 4 | babc | 4 | 01000 |
| 5 | ababc | 5 | 10000 |

TABLE 4

Contents of nodes along the path from root to $N_p$ on $T_s$

| Node number | Label | First symbol | Prefix number | Suffix number | Internal range | PIF | PIP | Depth |
|---|---|---|---|---|---|---|---|---|
| 0 (root) | NULL | — | — | — | — | 0 | 0 | 0 |
|  | b | b | 0 | 0 | [2, 2] (or [4, 4]) | 0 | 0 | 1 |
|  | c | b | 0 | 2 | [4, 5] | 0 | 0 | 2 |
|  | a | b | 1 | 2 | [0, 0] | 0 | 0 | 3 |
|  | b | b | 2 | 2 | [0, 0] | 0 | 0 | 4 |
|  | a | b | 3 | 2 | [0, 0] | 0 | 0 | 5 |
|  | b | b | 4 | 2 | [0, 0] | 0 | 0 | 6 |
| $N_1$ | c | b | 5 (=m) | 2 | [0, 0] | 1 | 0 | 7 |
|  | x | b | 0 | 2 | [0, 0] | 1 | $N_1$ | 8 |
|  | a | b | 1 | 2 | [0, 0] | 1 | $N_1$ | 9 |
|  | b | b | 2 | 2 | [0, 0] | 1 | $N_1$ | 10 |
|  | a | b | 3 | 2 | [0, 0] | 1 | $N_1$ | 11 |
|  | b | b | 4 | 2 | [0, 0] | 1 | $N_1$ | 12 |
| $N_2$ | c | b | 5 (=m) | 2 | [0, 0] | 1 | $N_1$ | 13 |
|  | x | b | 0 | 2 | [0, 0] | 1 | $N_2$ | 14 |
| $N_p$ | x | b | 0 | 2 | [0, 0] | 1 | $N_2$ | 15 |

TABLE 5

Brief summary of the results when the last three chunks are processed

| | The last three chunks that had been processed | | | $N_p$'s chunk |
|---|---|---|---|---|
| S = ... | xxx | xxxx | xaba | bcababcxababcxx |
| Depth = | 3 | 4 | 4 | |
| COUNT = | 92 | 96 | 100 | |
| Prefix = | 0 | 0 | 3 | |

The Navarro-Raffinot (NR) scheme is a different bitmap based implementation was independently developed. As a generalization, the NR scheme can find all pattern occurrences and report their absolute positions. Below is a description of the NR scheme.

The NR scheme is a general technique to perform string matching when the text is presented as a sequence of atomic strings, called blocks, instead of a sequence of symbols. The blocks either have just one symbol or are formed by concatenating previously seen blocks. Let T' denote the text already processed at any moment of the search. When the search process is over, it holds that T'=T, the original text.

The blocks are processed one by one. For each new block B, a description for B which has all the information of the block that is relevant for the search is computed. This description is denoted by D(B) =(L, O, S, P, M), where L=|B|, the length of B in symbols =Offs(B)=the length in symbols of the text we had processed when B appeared S=Suff(B)=all the pattern positions which either start a complete occurrence of B inside the pattern, or start a proper pattern suffix which matches with a prefix of B. Formally, Suff($B$)={|$x$|,$P$ =$xBy$}∪{|$x$|,|$x$|>0^|$z$|>0^$P$=$xz$^$B$=$zy$}

P=Pref(B)=all the pattern positions which either follow a complete occurrence of B inside the pattern, or follow a proper pattern prefix which matches with a suffix of B. Formally, Pref($B$)={|$xB$|,$P$ =$xBy$^|$y$|>0}∪{|$z$|, |$z$|>0^|$y$|>0^$P$=$zy$^$B$=$xz$}

M=Matches(B)=all the block positions where the pattern occurs (∅ if |B|<|P|). Formally, Matches($B$)={|$x$|,$B$=$xPy$}

Note that, to simplify the notation, the pattern positions start at zero in the above description, while in previous sections, the pattern positions start at one.

There are two cases for a new block B: (a) the block is a symbol or (b) the block is a concatenation of other blocks previously known. For case (a), the description D(B) can be obtained directly and, for case (b), it can be derived from the descriptions of the previous blocks.

Once the description of the new block is computed, it is used to update the states of the search. This concludes the processing of a block and the search process moves to the next one. The states of the search contains the matches that have already occurred and the potential matches in progress, that is, Res(T')=the text positions that matched up to now. Formally, Res($T'$)={|$x$|,$T'$=$xPy$}

Active(T')=the set of positions following the pattern prefixes which match a suffix of the current text. Formally, Active($T'$)={|$x$|,|$x$|>0^|$y$|>0^$P$=$xy$^$T'$=$zx$}

Hence, when the text processing is complete and T' is the whole text, Res(T) is the answer. The initial state of the search is Res(ε)=Active(ε)=∅, and T'=ε, where ε denotes the empty string.

Four operations which are used in the search process are defined below.

Left$_i$, which receives a set of Suff( ) positions not smaller than i, subtracts i to all them and then adds new pattern positions filling the holes left by the shift. Formally, Left$_i$($X$)={$x-i,x∈X$}∪{$m-i,m-i+1,\ldots,m-1$}

Right$_i$, which does the same for Pref( ) positions, in the other direction. Formally, Right$_i$($X$)={$x+i,x∈X$}∪{$1,2,\ldots,i$}

Add$_i$(X)={$i+x, x∈X$}, which adds i to all the elements of the set.

Subtr$_i$(X)={$i-x, x∈X$}, which subtracts all the elements of the set from i.

The base case of the scheme is to obtain the description of a block which is a symbol a. It is given that

|$B$|=1

Offs($B$)=|$T'$|

Suff($B$)={|$x$|,$P$ =$xay$}

Pref($B$)={|$xa$|,$P$ =$xay$^|$y$|>0}

Matches($B$)=if $P$=$a$ then {0} else ∅ which are direct applications of the general formulas.

Assume that block B is defined as the concatenation of one or more previous blocks. If B is identical to one previous block B', the description of B' is copied for B. Assume that B is a concatenation of two blocks $B_1$ and $B_2$. Note that it suffices to study concatenation of two blocks because the case of more than two blocks is a simple iteration over this procedure. The description for their concatenation D(B)=D($B_1B_2$)= D($B_1$)·D($B_2$) (where · is a notation for concatenation of block descriptions) is needed. The formulas are as follows:

|$B$|=|$B_1$|+|$B_2$|

Offs($B$)=|$T'$|

Suff($B$)=Suff($B_1$)∩Left$_{|B_1|}$(Suff($B_2$))

Pref($B$)=Pref($B_2$)∩Right$_{|B_2|}$(Pref($B_1$))

Matches($B$)=Matches($B_1$)∪Add$_{|B_1|}$(Matches($B_2$))∪ (Subtr$_{|B_1|}$(Pref($B_1$)∩Suff($B_2$))∩{0,1,2, . . . , |$B$|−$m$})

The states of the search after processing a new block B needs to be updated. The formulas to obtain the new Res(T'B) and Active(T'B) values from the old Res(T') and Active(T') ones are:

Active($T'B$)=Right$_{|B|}$(Active($T'$))∩Pref($B$)

Res($T'B$)=Res($T'$)∪Add$_{|T'|}$(Matches($B$))∪Subtr|$T'$| (Active($T'$)∩Suff($B$)∩{$m-|B|,m-|B|+1,\ldots,m-1$})

The above searching technique can be easily realized with two sets of bitmaps, Pref(B) and Suff(B), for every block B. The length of every bitmap for Pref(B) and Suff(B) is equal to m, the pattern length. For LZW compressed sequences, the number of bitmaps for Pref(B) and the number of bitmaps for Suff(B) are the same as the number of nodes on the LZW trie. This number tends to be large for a big file. The states of the search, i.e., Res(T') and Active(T'), and the result of each block B, i.e., Matches(B), can be represented by either bitmaps or arrays of numbers. In the comparison presented in the next section, it is assumed that Active(T') is represented by an m-bit bitmap and Res(T') and Matches(B) are represented by arrays of numbers. The reason to represent Res(T') as an array of numbers is that it is more space efficient because the number of pattern occurrences is usually much smaller than the file size. The reason to represent Matches(B) as an array of numbers is that O($\log_2 b$) bits take less space than O(b) bits, where b is the maximum block length. It is assumed that the number of pattern occurrences inside a block is constant.

In comparison with the NR scheme, the number of bitmaps in the proposed invention, including prefix bitmaps, suffix bitmaps, and the bitmaps associated with the nodes on the compacted suffix trie $ST_P$ is O(m). Each bitmap has m bits. The number of nodes on the compacted suffix trie $ST_p$ is O(m). Each node can be identified by a number of size O($\log_2 m$) bits. The LZW trie $T_S$ takes space O(t), where t is the number of nodes on $T_S$. The prefix number, the suffix number, and the internal ranges stored in every node of $T_S$ are replaced by three pointers, each of size O($\log_2 m$) bits, which point to the appropriate bitmaps. The node number and the PIP pointer of each LZW node take space O($\log_2 t$) bits. The depth of each node takes space O($\log_2 b$) bits, where the maximum block (chunk) length b is equivalent to the maximum node depth on $T_S$. Therefore, the space complexity of the generalized algorithm is O($m^2+t\log_2 m+t\log_2 t+t\log_2 b+m\log_2 m$) bits.

In the NR scheme, the number of elements stored in Res(T) is O(r) and each element requires $O(\log_2 u)$ bits, where r is the number of pattern occurrences in the text. Each LZW node carries a description. Thus, it requires O(t) descriptions and each of them carries an identifier of size $O(\log_2 t)$ bits. Besides, each of the O(t) description contains five elements, L, O, S, P and M. The element L is equivalent to the depth field in our generalized scheme and requires $O(\log_2 b)$ bits. Assume that the number of pattern occurrences inside an LZW chunk is upper bounded by a constant so that the size of the element M is $O(\log_2 b)$ bits. Note that there are O(t) bitmaps of S and O(t) bitmaps of P, each of the bitmaps has m bits. Clearly, the space requirement of these two sets of bitmaps is O(tm), which increases proportional to the size of the LZW trie t. The term O(tm) indicates that the space requirement increases significantly with increasing m if t is large. In a system where each character is represented by 8 bits, t is initially 256 before compression starts. After compression, t is often much larger than 256 for a large file. Another significant difference between the NR scheme and our generalized scheme is that r affects the space requirement of the NR scheme, but not ours. Since the element O in the description is not necessary for every node, it is assumed that it is omitted and instead a global counter COUNT is adopted. In summary, the space complexity of the NR scheme is $O(tm+t\log_2 t+t\log_2 b+r\log_2 u)$ bits.

Let's consider more examples for the proposed invention. Let P =abcab->m=5. Table 6 and Table 7 show the prefix bitmaps and the suffix bitmaps of P, respectively. Table 6 and Table 7 can be built before hand since P is known and the bitmap can be assigned to each prefix and suffix and stored in the memory.

TABLE 6

Prefix bitmaps

| $P_x$ | Prefix | Bitmap # | Bitmap |
|---|---|---|---|
| 0 | NULL | 1 | 00000 |
| 1 | a | 2 | 01000 |
| 2 | ab | 3 | 00100 |
| 3 | abc | 4 | 00010 |
| 4 | abca | 5 | 01001 |
| 5 | abcab | 6 | 00100 |

TABLE 7

Suffix bitmaps

| $S_x$ | Suffix | Bitmap # | Bitmap |
|---|---|---|---|
| 1 | b | 1 | 00001 |
| 2 | ab | 2 | 00010 |
| 3 | cab | 3 | 00100 |
| 4 | bcab | 4 | 01001 |
| 5 | abcab | 5 | 10010 |

$Q_2(P_x, S_x)$ can be obtained by performing a bit-wise AND operation of the corresponding prefix bitmap and suffix bitmap. Let $S_1$=abca and $S_2$=bcab, then, $S_1$=abca->$P_x$=4->bitmap_$S_1$=01001

$S_2$=bcab->$S_x$=4->bitmap_$S_2$=01001

When bitmap_$S_1$ and bitmap_$S_2$ are ANDed, [01001] AND [01001], the result is [01001].

[01001]

Index =01234

The number of "1" in the result of AND operation indicates the number of pattern occurrence in $S_1 S_2$. In this example, there are two "1," which indicates that there are two occurrence of the pattern. The concatenation of $S_1$ and $S_2$ then yields abcabcab, and it can be easily see that there are two occurrence of the pattern P=abcab. The rightmost "1" in the result of AND operation is indexed 4, which indicates that the maximum contribution of $S_1$ in the occurrence are 4 characters.

For P=ababc ->m=5 discussed above, FIG. 8, FIG. 9, and FIG. 10 illustrates prefix bitmaps, internal chunks of P, and suffix bitmaps, respectively. Let $S_1$=a and $S_2$=bab, then $P_x$ for $S_1$ is 1 and I for $S_2$ is [2, 4]. Therefore, $Q_1(P_x, I)=Q_1(1, [2, 4])=2$ which represents the length of the longest prefix of P that is a suffix of $S_1 S_2$. The concatenation $S_1 S_2$ is (abab) and the longest prefix of P that is a suffix of $S_1 S_2$ is (ab), whose length is 2.

Figures 11, 12, 13, 14:
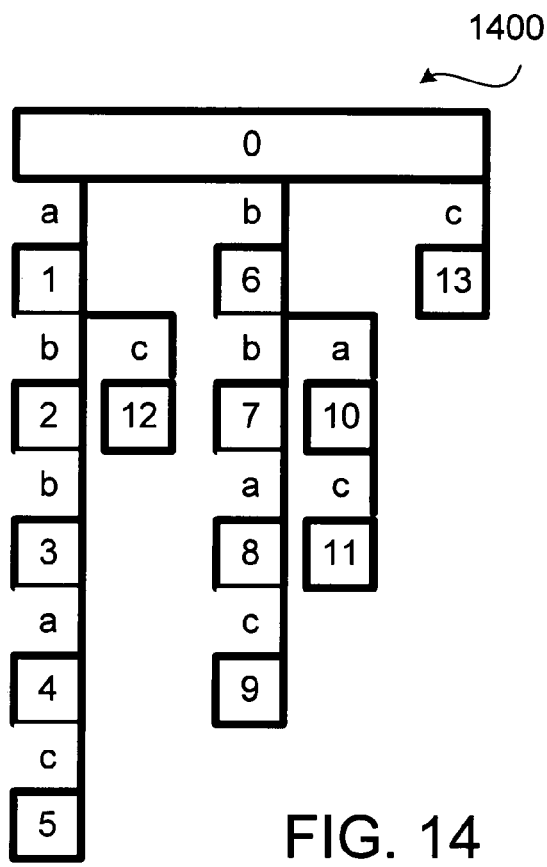
FIGS. 11, 12, and 13 illustrate a prefix table, a suffix table, and an internal chunk table for another search pattern.
FIG. 14 illustrates a suffix trie for a search pattern.

The following is another example. For P =abbac->m=5, FIG. 11, FIG. 12, and FIG. 13 illustrates the prefix bitmaps, the suffix bitmaps, and internal chunks of P, respectively. Let $S_1$=abb and $S_2$=a, then $P_x$ for $S_1$ is 3 and I for $S_2$ is [1, 1]. Therefore, $Q_1(P_x, I)=Q_1(3, [1, 1])=4$ which represents the length of the longest prefix of P that is a suffix of $S_1 S_2$. The concatenation $S_1 S_2$ is (abba) and the longest prefix of P that is a suffix of $S_1 S_2$ is (abba), whose length is 4.

Now, $Q_3$ is answered by tracing a suffix trie of a pattern P. Take P =abbac, the corresponding suffix trie $ST_p$ for P =abbac is illustrated in FIG. 14. Each internal substring of P is represented by a node in a suffix trie $ST_p$. For example, substring (abb) is represented by node 3 and substring (ac) is represented by node 12. The construction of a suffix trie is done as follows. Firstly, let the $k^{th}$ suffix be the pattern suffix with length k, $1 \leq k \leq m$. Next, construct the suffix trie branches from the $m^{th}$ suffix to the $1^{st}$ suffix. During the construction, each time a new node is added to the trie, it is assigned a node number sequentially. The root node is numbered 0 and the firstly added node is numbered 1. For the $m^{th}$ suffix (abbac), each prefix of it is represented by a node: (a) is represented by node 1, (ab) is represented by node 2, (abb) is represented by node 3, so on, so forth. After the $m^{th}$ suffix, the $(m-1)^{th}$ suffix (bbac) is added to the suffix trie. Again, each prefix of (bbac) is represented by a node. The next suffix is (bac). The prefix (b) of (bac) is already in the trie and represented by node 6, therefore, no new node is needed. The prefix (ba) is represented by node 10 and (bac) is represented by node 11.

After the suffix trie is constructed, $Q_3$ can be determined. For suffix trie of FIG. 14 and P =abbac, if $S_1$=ab and $\alpha$=b $Q_3(S_1, \alpha)=[1, 3] \rightarrow$ node 3 which means that $S_1 \alpha$ (abb) is an internal substring of P. If $S_1$=ba and $\alpha$=c, then $Q_3(S_1, \alpha)=[3, 5] \rightarrow$ node 11 which means that $S_1 \alpha$ (bac) is an internal substring of P. If $S_1 \alpha$ is not a substring of P, then $Q_3(S_1, \alpha)=[0, 0]$.

Figure 15:
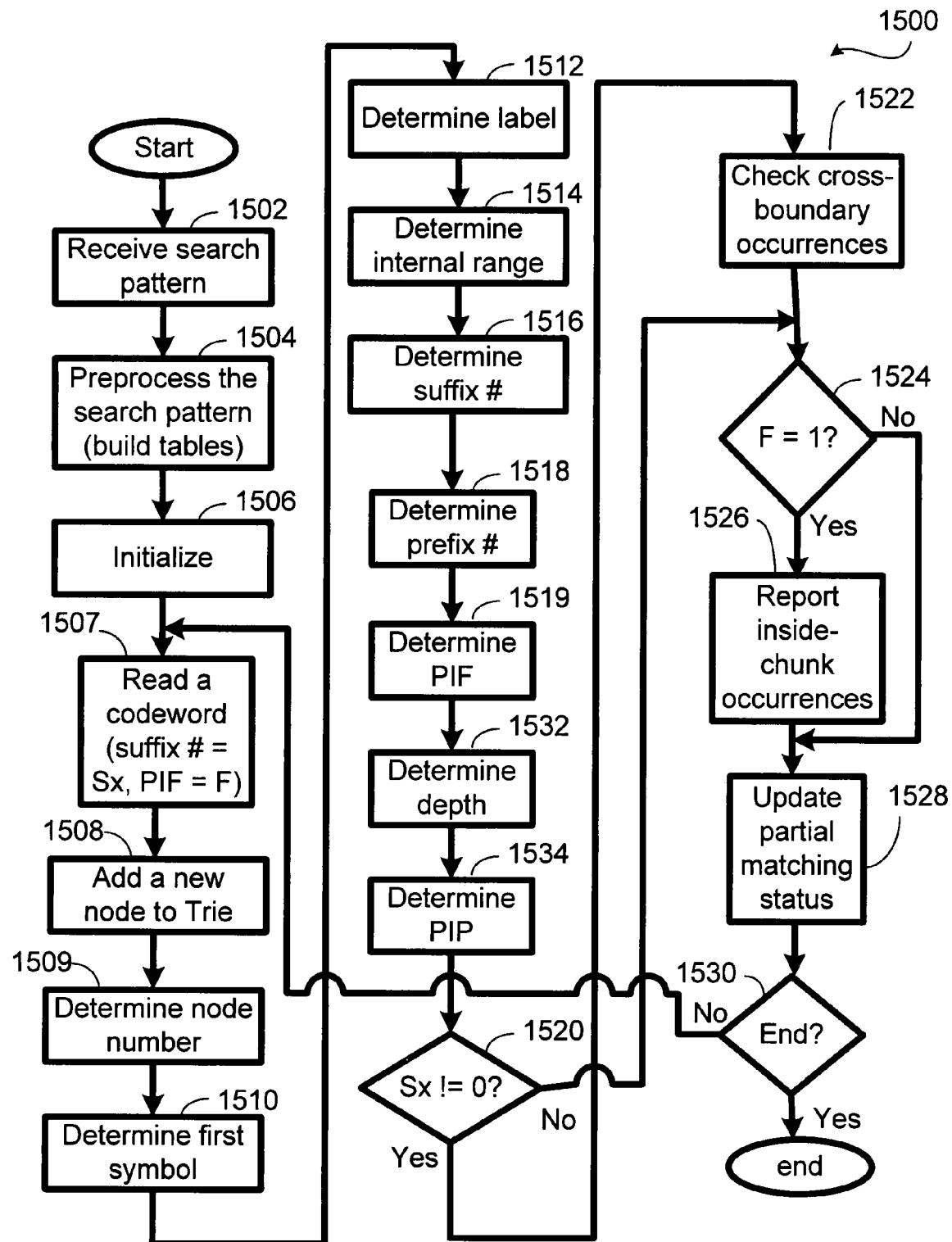
FIG. 15 is a flowchart for a pattern search process.

FIG. 15 is a flowchart for a compressed pattern matching process according to one embodiment of the invention. The process is divided into two parts: pattern preprocessing and compressed text scanning. After the pattern is received, step 1502, it is preprocessed according to the preprocessing described previously, step 1504, and a compacted suffix trie for the searched pattern with associated bitmaps are determined. After the preprocessing, the compressed text scanning can then be done. The compressed text scanning process consists of two components: LZW trie construction and the actual pattern search. When constructing the LZW Trie, each node's node number, label, prefix number, suffix number, internal range, first symbol, depth, PIF, and PIP are computed and stored. The process is initialized, step 1506, to process each LZW chunk. Each LZW chunk is represented by a codeword in the compressed text. A codeword is read, step 1507. (Assume the currently read codeword has suffix #=Sx and PIF =F.) A new node is added to the Trie, step 1508, and several elements of this node are determined. The elements includes a node number, step 1509, the first symbol, step 1510, the label, step 1512, the internal range, step 1514, the suffix number, step 1516, the prefix number, step 1518, the PIF, step 1519, the depth, step 1532, and the PIP, step 1534. The determination of these elements is done according to processes described previously.

After the determination of all elements of a new node, the process switches to pattern search. If Sx is not zero, the cross-boundary occurrences are checked, step 1522. If F equals one, which indicates the pattern is inside the currently processed data chunk, then the positions of the inside-chunk occurrences are determined, step 1526. After checking for the cross-boundary condition and inside condition, the partial matching status (recorded by the global variable Prefix) is updated, step 1528, and the process is repeated for the next chunk. This process allows detection of all pattern occurrences and determination of their absolute positions in the uncompressed text. In the compressed pattern matching process of the invention, the queries $Q_1$ and $Q_2$ performed during the determination of information for each node and the pattern search employ bitmap implementations. By the process, all occurrences of the searched pattern can be detected instead of just the first one.

Figure 1B:
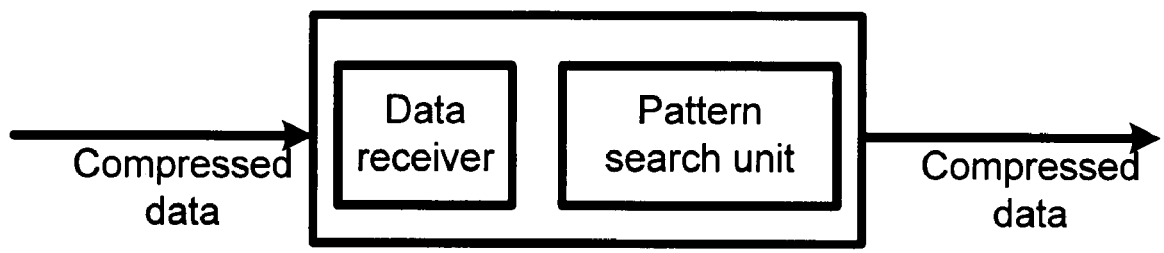
FIG. 1B illustrates a scheme for pattern searching in a compressed data.

The process depicted in FIG. 15 can be implemented through a specialized server equipped to receive a stream of compressed data as illustrated in FIG. 1B. The compressed data are received through a data receiving unit and analyzed by a content searching unit that may include a controller capable of analyzing the compressed data according to the process depicted in FIG. 15.

In view of the method being executable on networking devices, the method can be performed by a program resident in a computer readable medium, where the program directs a server or other computer device having a computer platform to perform the steps of the method. The computer readable medium can be the memory of the server, or can be in a connective database. Further, the computer readable medium can be in a secondary storage media that is loadable onto a networking computer platform, such as a magnetic disk or tape, optical disk, hard disk, flash memory, or other storage media as is known in the art.

In the context of FIG. 15, the steps illustrated do not require or imply any particular order of actions. The actions may be executed in sequence or in parallel. The method may be implemented, for example, by operating portion(s) of a network device, such as a network router or network server, to execute a sequence of machine-readable instructions. The instructions can reside in various types of signal-bearing or data storage primary, secondary, or tertiary media. The media may comprise, for example, RAM (not shown) accessible by, or residing within, the components of the network device. Whether contained in RAM, a diskette, or other secondary storage media, the instructions may be stored on a variety of machine-readable data storage media, such as DASD storage (e.g., a conventional "hard drive" or a RAID array), magnetic tape, electronic read-only memory (e.g., ROM, EPROM, or EEPROM), flash memory cards, an optical storage device (e.g. CD-ROM, WORM, DVD, digital optical tape), paper "punch" cards, or other suitable data storage media including digital and analog transmission media.

While the invention has been particularly shown and described with reference to a preferred embodiment thereof, it will be understood by those skilled in the art that various changes in form and detail may be made without departing from the spirit and scope of the present invention as set forth in the following claims. Furthermore, although elements of the invention may be described or claimed in the singular, the plural is contemplated unless limitation to the singular is explicitly stated.

What is claimed is:

1. A method for searching a pattern in a compressed data, comprising the steps of:
   receiving a compressed data, the compressed data having a plurality of data chunks;
   obtaining a first data chunk from the compressed data;
   retrieving a first bitmap from a first table based on the first data chunk;
   obtaining a second data chunk from the compressed data;
   retrieving a second bitmap from a second table based on the second data chunk;
   deriving a first result by a bit-wise ANDing the first bitmap with the second bitmap; and
   indicating the pattern being present in the compressed data if there is at least one bit set in the first result.

2. The method of claim 1, wherein the compressed data being compressed according to a LZW compression algorithm.

3. The method of claim 1, further comprising the step of detecting more than one presence of the pattern if there are at least two bits set in the first result.

4. The method of claim 1, further comprising the step of constructing a suffix trie for the pattern.

5. The method of claim 4, further comprising the step of determining prefix bitmaps, and suffix bitmaps for the suffix trie.

6. The method of claim 1, further comprising the step of constructing a LZW trie from the compressed data received.

7. The method of claim 6, wherein the LZW trie includes a plurality of nodes, each node having a node number, a label, a prefix number, a suffix number, an internal range, a first symbol, a depth, a PIF, and a PIP.

8. An apparatus for searching a pattern in a compressed data comprising:
   a data receiving unit for receiving compressed data from a data source; and
   a content search unit capable of analyzing the received compressed data, the content search unit further being capable of performing the steps of:
   receiving a compressed data, the compressed data having a plurality of data chunks;
   obtaining a first data chunk from the compressed data;
   retrieving a first bitmap from a first table based on the first data chunk;
   obtaining a second data chunk from the compressed data;
   retrieving a second bitmap from a second table based on the second data chunk;
   deriving a first result by a bit-wise ANDing the first bitmap with the second bitmap; and
   indicating the pattern being present in the compressed data if there is at least one bit set in the first result.

9. The apparatus of claim 8, wherein the content search unit further being capable of performing the step of detecting more than one presence of the pattern if there are at least two bits set in the first result.

10. The apparatus of claim 8, wherein the content search unit further being capable of performing the step of constructing a suffix trie for the pattern.

11. The apparatus of claim 8, wherein the content search unit further being capable of performing the step of determining prefix bitmaps and suffix bitmaps for the suffix trie.

12. The apparatus of claim 8, wherein the content search unit further being capable of performing the step of constructing a LZW trie from the compressed data received.

13. The apparatus of claim 12, wherein the LZW trie includes a plurality of nodes, each node having a node number, a label, a prefix number, a suffix number, an internal range, a first symbol, a depth, a PIF, and a PIP.

* * * * *